United States Patent
Kim

(10) Patent No.: US 7,104,476 B2
(45) Date of Patent: Sep. 12, 2006

(54) MULTI-SECTORED FLAT BOARD TYPE SHOWERHEAD USED IN CVD APPARATUS

(75) Inventor: Kwang-Sik Kim, Kyunggi-Do (KR)

(73) Assignee: Jusung Engineering Co., Ltd., (KR)

( * ) Notice: Subject to any disclaimer, the term of this patent is extended or adjusted under 35 U.S.C. 154(b) by 137 days.

(21) Appl. No.: 10/299,637

(22) Filed: Nov. 19, 2002

(65) Prior Publication Data

US 2003/0098372 A1    May 29, 2003

(30) Foreign Application Priority Data

Nov. 23, 2001    (KR)    ............... 10-2001-0073337

(51) Int. Cl.
  *B05B 1/14*    (2006.01)
  *C23F 1/00*    (2006.01)
  *C23C 16/00*    (2006.01)

(52) U.S. Cl. ............... 239/557; 239/590.5; 239/566; 239/568; 156/345.14; 156/345.17; 156/345.34; 118/715; 118/719; 427/248.1

(58) Field of Classification Search ............... 239/547, 239/590.3, 550, 590.5, 557, 548, 562, 76, 239/569, 566, 568; 156/345.14, 345.17, 156/345.34; 118/715, 719, 725, 730; 427/446, 427/248.1, 421, 421.1
See application file for complete search history.

(56) References Cited

U.S. PATENT DOCUMENTS

| | | | | |
|---|---|---|---|---|
| 1,912,254 A | * | 5/1933 | Calhoon | 431/177 |
| 1,927,019 A | * | 9/1933 | Branche | 431/172 |
| 1,950,470 A | * | 3/1934 | Bellamy | 431/347 |
| 2,002,448 A | * | 5/1935 | Dodge | 431/177 |
| 3,000,184 A | * | 9/1961 | Fish | 60/258 |
| 3,192,989 A | * | 7/1965 | Miller | 431/287 |
| 4,780,169 A | * | 10/1988 | Stark et al. | 156/345.34 |
| 4,976,996 A | * | 12/1990 | Monkowski et al. | 427/255.5 |
| 5,281,295 A | * | 1/1994 | Maeda et al. | 156/345.29 |
| 5,445,699 A | * | 8/1995 | Kamikawa et al. | 156/345.24 |
| 5,772,764 A | * | 6/1998 | Akimoto | 118/319 |
| 5,781,693 A | | 7/1998 | Ballance et al. | |

(Continued)

FOREIGN PATENT DOCUMENTS

KR    2000-51046    8/2000

OTHER PUBLICATIONS

English translation of Abstract of Korean patent application No. 2000-51046 dated Aug. 16, 2000.

(Continued)

*Primary Examiner*—David A. Scherbel
*Assistant Examiner*—Seth Barney
(74) *Attorney, Agent, or Firm*—Ostrolenk, Faber, Gerb & Soffen, LLP

(57) ABSTRACT

Disclosed is a showerhead of a CVD apparatus comprising a plate having an empty inside and provided with a plurality of injection holes at one surface thereof; and gas supplying pipes installed at the plate so as to supply gas, wherein introduced gas thereto is injected to an upper space of the wafer through the injection holes, the plate is divided in a radial manner on the basis of a center point to be divided into a plurality of sectors having respective inner spaces independently, and the gas supplying pipes are connected to the respective sectors. According to that, gas can be independently supplied to each sector of the showerhead, thereby easily applying the CVD apparatus not only to a batch type process but also to an atomic layer deposition method.

13 Claims, 4 Drawing Sheets

U.S. PATENT DOCUMENTS

| | | | |
|---|---|---|---|
| 5,958,510 A * | 9/1999 | Sivaramakrishnam et al. | 427/255.6 |
| 6,183,241 B1 * | 2/2001 | Bohn et al. | 431/326 |
| 6,203,619 B1 * | 3/2001 | McMillan | 118/719 |
| 6,215,106 B1 * | 4/2001 | Boas et al. | 219/390 |
| 6,796,517 B1 * | 9/2004 | Pike | 239/557 |
| 6,838,115 B1 * | 1/2005 | Kumar et al. | 427/58 |

OTHER PUBLICATIONS

Untranslated Korean Office Action dated Sep. 26, 2003 corresponding to Korean application No. 10-2001-0073337.

* cited by examiner

MULTI-SECTORED FLAT BOARD TYPE SHOWERHEAD USED IN CVD APPARATUS

BACKGROUND OF THE INVENTION

1. Field of the Invention

The present invention relates to a showerhead, and particularly, to a flat board type showerhead used in a CVD apparatus, in which gas is injected into a reaction chamber.

2. Description of the Background Art

A CVD process is very important in a method how to supply reaction gas into a reaction chamber and exhaust. The reason is because that a hydrodynamic flow of gas greatly influences to a thin film deposition. Recently, a showerhead is much used for gas injection. That is because a thin film having a good uniformity through a wide area can be obtained- by uniformly injecting gas through the wide area.

FIG. 1 is a schematic view to explain a CVD apparatus in accordance with the conventional art.

Referring to FIG. 1, a reaction chamber 10 is covered with a chamber lid 20 and provides a reaction space hermetic from the outside. An O-ring 30 is installed at an engaged portion between the chamber lid 20 and the chamber 10 so as to effectively shield the reaction space from the outside.

A slot valve 60 is installed at a lateral wall of the chamber 10. The slot valve 60 has to be opened so as to transfer a wafer 50 from a load rock chamber (not shown) into the chamber 10. A wafer supporting member 40 is installed in the chamber 10, and the wafer 50 is located on the wafer supporting member 40. The wafer supporting member 40 can be moved up and down by a transferring means 45. A heater (not shown) for heating the wafer 50 is mounted at an inner portion of the wafer supporting member 40.

A showerhead 70 is connected with a gas injection pipe 80a. The showerhead 70 is provided with a plurality of injection holes (displayed as a dotted line) at an opposite surface to the wafer 50. Gas supplied to the showerhead 70 through the gas injection pipe 80a is uniformly injected to an entire surface of the wafer 50 through the injection holes. The injected gas is exhausted through a gas exhaustion pipe 80b.

The aforementioned CVD apparatus in accordance with the conventional art has advantages that a uniform deposition of a thin film is possible even if a diameter of the wafer 50 is large and a plasma enhanced chemical vapor deposition (PECVD) can be easily performed by using the showerhead 70 as a plasma electrode.

However, the conventional art has a disadvantage that various gas is not independently supplied through the showerhead 70. Accordingly, the CVD apparatus provided with the showerhead is mainly used as a single wafer type and has a difficulty in being applied to an atomic layer deposition (ALD) method for controlling various gas independently and supplying.

SUMMARY OF THE INVENTION

Therefore, an object of the present invention is to provide a showerhead of a CVD apparatus, in which various gas is independently supplied so as to solve the aforementioned problems.

Also, another object of the present invention is to provide a CVD apparatus, in which an atomic layer deposition (ALD) is possible by controlling various gas independently.

To achieve these and other advantages and in accordance with the purpose of the present invention, as embodied and broadly described herein, there is provided a showerhead comprising: a plate having an empty inside and provided with a plurality of injection holes at one surface thereof; and a gas supplying pipe installed at the plate for supplying gas, wherein introduced gas thereto is injected to an upper space of the wafer through the injection holes, the plate is divided in a radial manner on the basis of a center point to be divided into a plurality of sectors having respective inner spaces independently, and the gas supplying pipe is connected to the respective sectors.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, preferred embodiments of the present invention will be explained with reference to FIGS. 2A to 2D.

Figure 1:
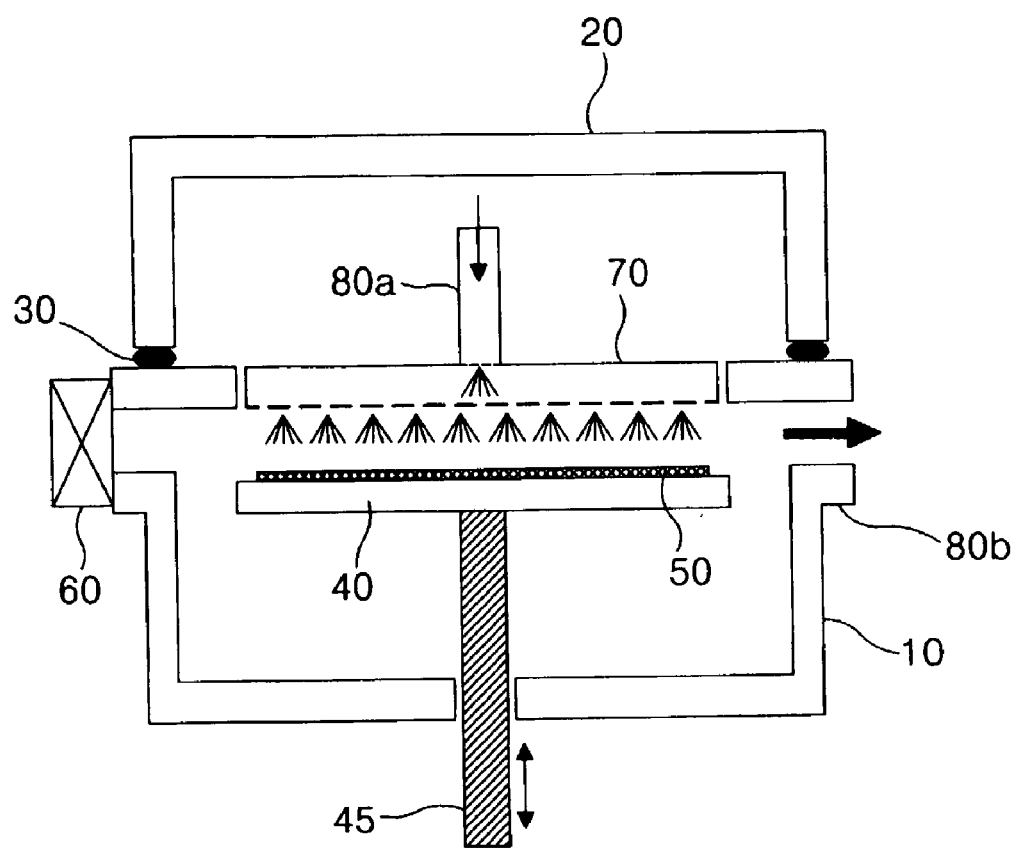
FIG. 1 is a schematic view to explain a showerhead of a CVD apparatus in accordance with the conventional art.
Figure 2A:
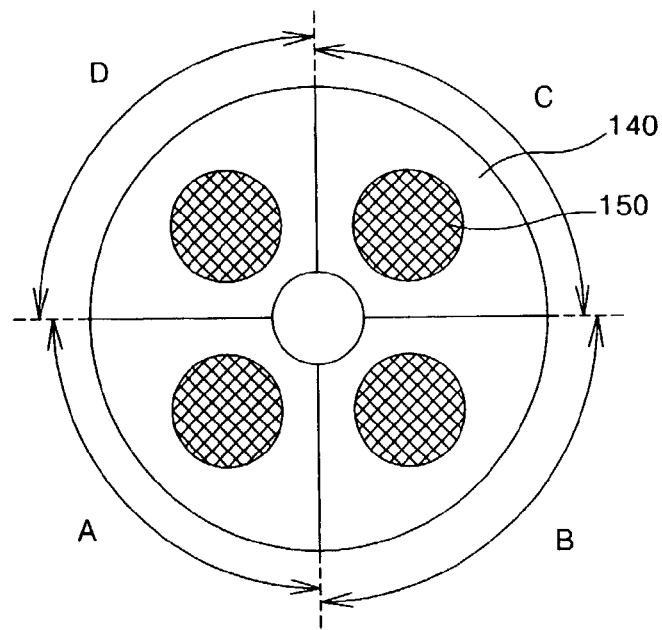
FIG. 2A is a plane view showing an arrangement of a wafer.

FIG. 2A is a plane view showing an arrangement of a wafer 150. Referring to FIG. 2A, a wafer supporting member 140 is divided in a radial manner on the basis of a center point to be divided into 4 blocks A, B, C, and D, and a wafer 150 is located on the respective blocks A, B, C, and D.

Figure 2B:
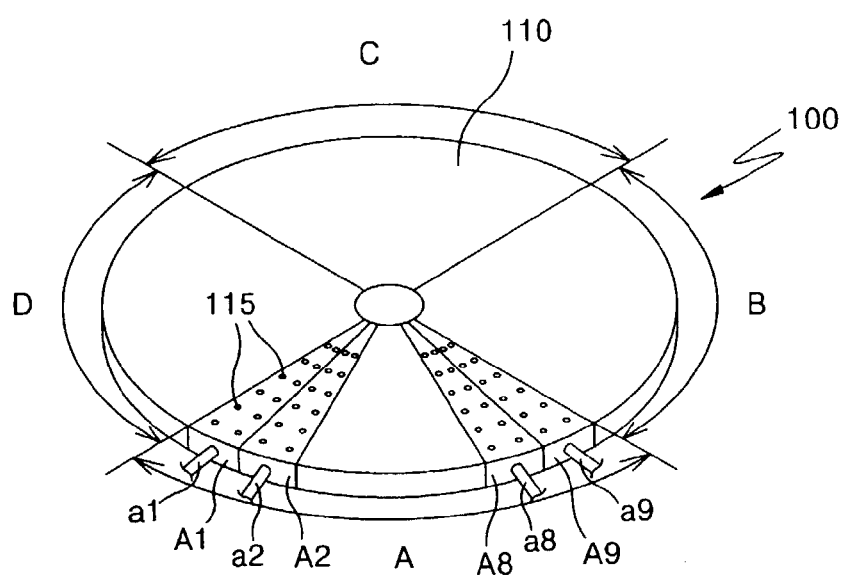
FIG. 2B is a perspective view showing a showerhead according to the present invention.
Figure 2C:
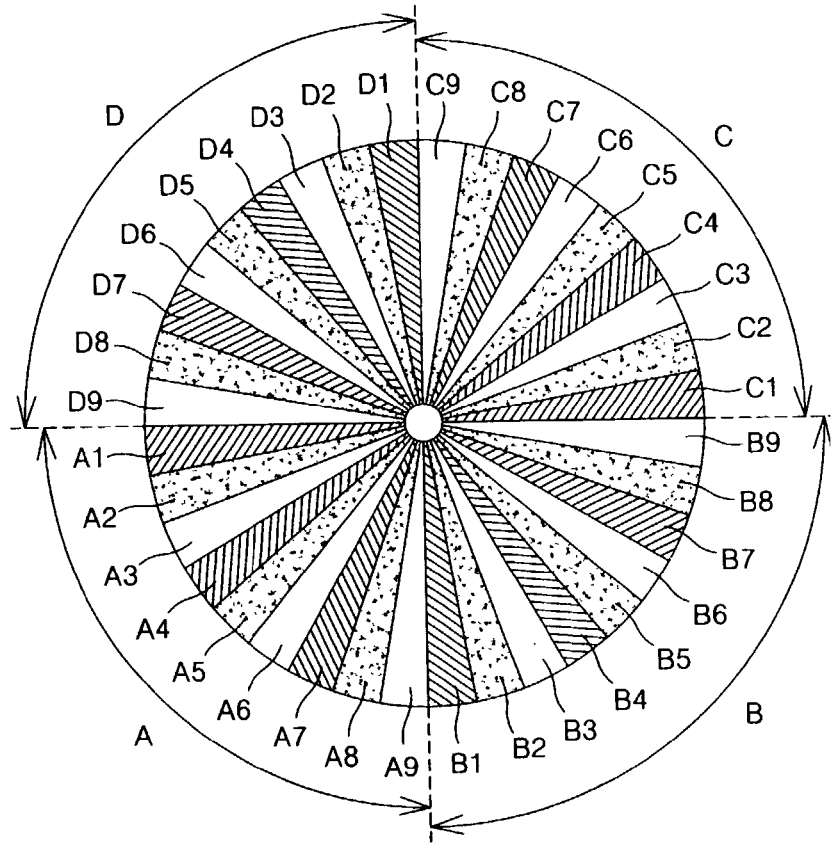
FIG. 2C is a plane view showing each sector of a showerhead according to the present invention.

FIGS. 2B and 2C are views to explain a showerhead 100.

Referring to FIG. 2B, the shower head 100 includes a plate 110 and gas supplying pipes a1 to a9. Even if the gas supplying pipes are illustrated only in A block, the gas supplying pipes are formed in the rest blocks. The inside of the plate 110 is empty, and an opposite surface to the wafer 150 is provided with a plurality of injection holes 115 arranged with a predetermined width. The gas supplying pipes can be formed at a lateral surface of the showerhead or on a surface not opposite to the wafer of the showerhead. Even if a shape of the plate is preferably a disc type as shown in Figures, another shapes of a polygon such as a rectangular shape, a hexagon, and an octagon are also possible.

Referring to FIG. 2C, the plate 110 is divided in a radial manner on the basis of a center point to be divided into 36 sectors (A1~A9, B1~B9, C1~C9, and D1~D9) having respective inner spaces independently. Accordingly, the four blocks A, B, C, and D of the showerhead 100 respectively include 9 sectors. However, it is possible to variously change the numbers of blocks and sectors differently from the illustrated drawings.

The gas supplying pipes are respectively connected to the sectors (A1~A9, B1~B9, C1~C9, and D1~D9) independently. The gas supplying pipes are connected to a gas supplying source (not shown). At this time, several gas supplying pipes can be connected to one gas supplying source, or the gas supplying pipes can be independently connected to different gas supplying sources, respectively. If gas is injected to each sector (A1~A9, B1~B9, C1~C9, and D1~D9) through the gas supplying pipes, the gas is sprayed to an upper space of the wafer 150 via the injection holes 115.

The plurality of injection holes are preferably formed at the respective sectors of the plate with predetermined intervals.

Figure 2D:
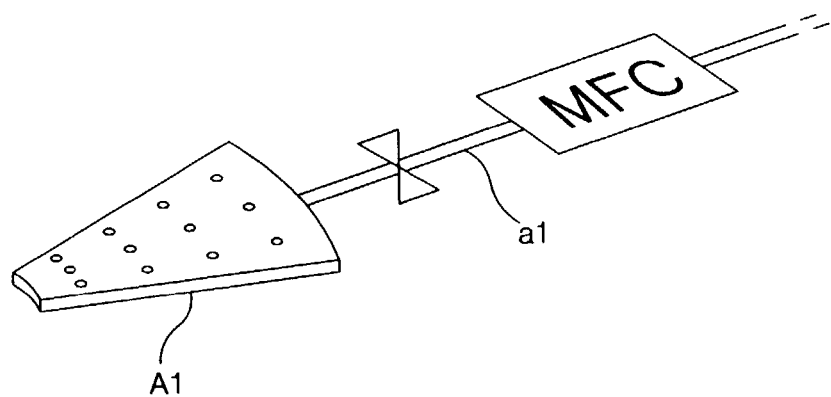
FIG. 2D is a partial enlargement view of FIG. 2C.

FIGS. 2D is a partial enlargement view of FIG. 2C, which shows a gas supplying pipe a1 connected to one sector A1. The gas supplying pipes connected to each sector can be provided with a valve and a mass flow controller independently, or can be provided with more than a valve and a mass flow controller integrated one another so as to simultaneously control several gas supplying pipes.

Figure 3:
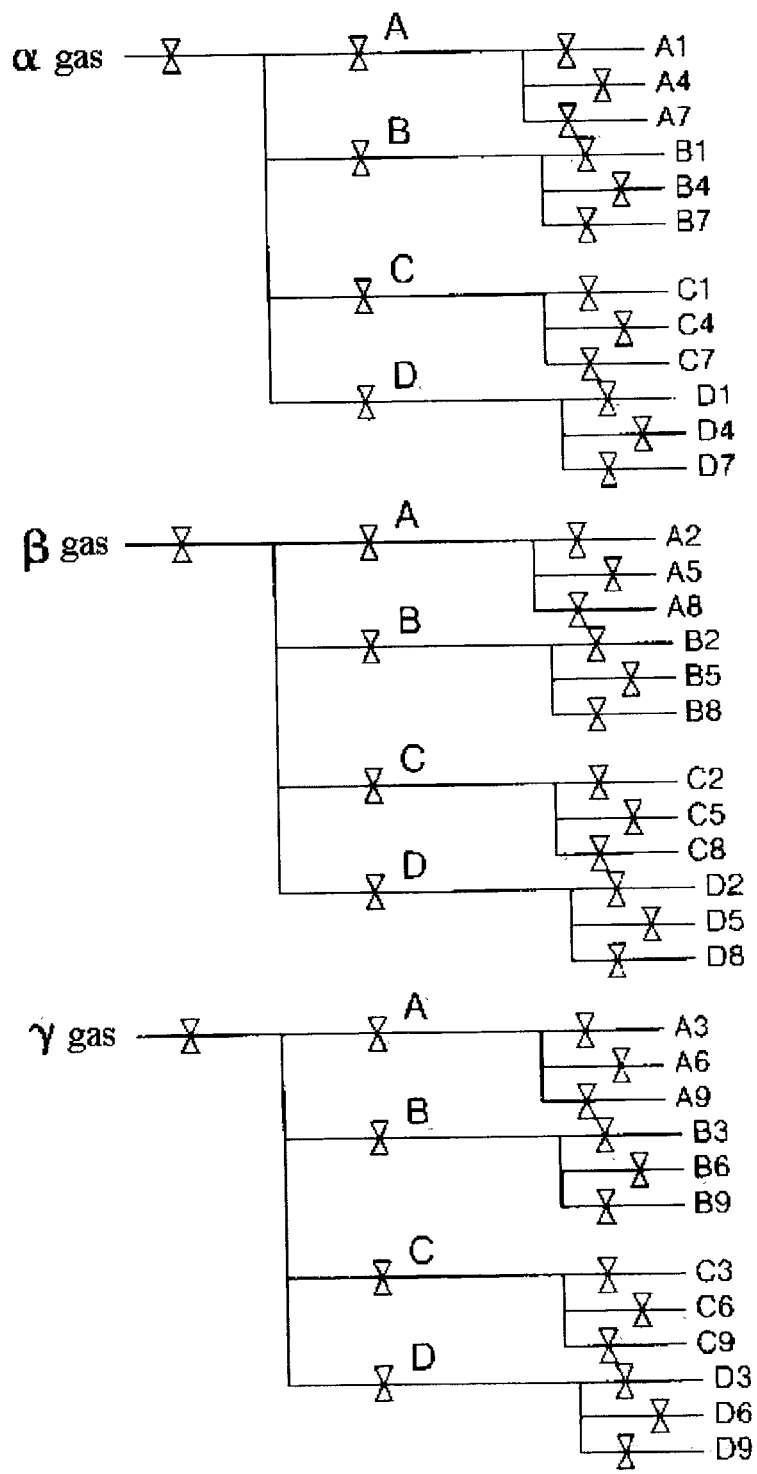
FIG. 3 is a processing view showing one embodiment of a method for supplying gas using a showerhead according to the present invention.

FIG. 3 is one embodiment of a showerhead according to the present invention, which explains a method for performing an ALD process on four wafers by using the showerhead.

First, all valves connected to A1, A4, and A7 sectors of A block, B1, B4, and B7 sectors of B block, C1, C4, and C7 sectors of C block, and D1, D4, and D7 sectors of D block are opened, thereby injecting α gas. According to that, the α gas is adsorbed on the wafers (150 of FIG. 2a) in each block.

Then, all the valves are closed, and all valves connected to A2, A5, and A8 sectors of the A block, B2, B5, and B8 sectors of the B block, C2, C5, and C8 sectors of the C block, and D2, D5, and D8 sectors of the D block are opened, thereby injecting β gas. According to that, the β gas is adsorbed on the wafers (150 of FIG. 2a) in each block (A, B, C, and D).

Next, with the same manner, γ gas is injected to A3, A6, and A9 sectors of the A block, B3, B6, and B9 sectors of the B block, C3, C6, and C9 sectors of the C block, and D3, D6, and D9 sectors of the D block, thereby adsorbing the γ gas on the wafer 150.

When the said process is performed, if the wafer is heated with a proper temperature by providing a heating means to the wafer supporting member (140 of FIG. 2A), atomic layers having several to hundreds of Å thickness are deposited and reacted reciprocally, thereby forming one thin film.

A process to inject gas by a different method from the aforementioned method will be explained.

First, α gas is injected to A1, B1, C1, and D1, respectively, β gas is injected to A2, B2, C2, and D2, and γ gas is injected to A3, B3, C3, and D3, sequentially.

Then, the α gas is injected to A4, B4, C4, and D4, respectively, the β gas is injected to A5, B5, C5, and D5, and the γ gas is injected to A6, B6, C6, and D6, sequentially.

Subsequently, the α gas is injected to A7, B7, C7, and D7, respectively, the β gas is injected to A8, B8, C8, and D8, and the γ gas is injected to A9, B9, C9, and D9, sequentially, thereby obtaining a very uniform thin film by the ALD process.

A thin film having a good quality can be obtained by controlling valves of the respective gas supplying pipes and selectively injecting the gas by various methods besides the aforementioned method.

As aforementioned, according to the present invention, gas can be independently supplied to each sector of the showerhead. Accordingly, the present invention can be easily applied not only to a batch type process but also to an atomic layer deposition.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A showerhead of a CVD apparatus comprising:
a plate having an inner space;
a plurality of injection holes formed at one surface of the plate; and
a plurality of gas supplying pipes formed to be connected to the plate,
wherein the plate is divided in a radial manner from its center to define a plurality of sectors having independent inner spaces and each of the gas supplying pipes is formed to be respectively connected to a corresponding sector of the plate, and
wherein the plurality of gas supplying pipes are respectively connected with a valve and a flow mass controller.

2. A showerhead apparatus comprising:
a plate constructed to function as a showerhead of a CVD (Chemical Vapor Deposition) device and formed of a plurality of sectors, each having an independent hollow inner space opened to one face of the plate through a plurality of injection holes wherein the plate is divided in a radial manner form a center of the plate to define the plurality of sectors; and
a plurality of independent gas supply pipes, each one of which respectively communicates with the hollow space of a corresponding one of said plurality of sectors.

3. The showerhead of claim 2, wherein the injection holes are arranged with predetermined intervals.

4. The showerhead of claim 2, wherein the plurality of gas supplying pipes are formed at a lateral surface of the plate.

5. The showerhead of claim 2, wherein the plurality of gas supplying pipes are respectively connected with a valve and a flow mass controller.

6. The showerhead of claim 5, wherein the plate is formed in a polygon shape.

7. The showerhead of claim 5, wherein the plate is formed in a disc shape.

8. The showerhead of claim 5, wherein each gas supplying pipe is connected to a corresponding gas source and a respective gas controller is installed between the gas supplying pipes and a corresponding gas source.

9. The showerhead of claim 5, wherein at least two gas supplying pipes are connected to the gas source.

10. The showerhead of claim 5, wherein each gas supplying pipe is independently connected to any other gas source.

11. A showerhead of a CVD apparatus comprising:
a plate constructed to function as a showerhead of a CVD (Chemical Vapor Deposition) device divided and formed of a plurality of sectors, the sectors being formed from the plate being divided in a radial manner from the center of the plate, each sector having an independent hollow inner space;

injection holes formed at one surface of each of the plurality of sectors of the plate;

a plurality of gas supplying pipes formed to be connected to the plate; and a gas controller installed at the gas supplying pipes.

12. The showerhead of claim 11, wherein each block is located on a corresponding wafer.

13. The showerhead of claim 11, wherein each gas supplying pipe is connected to a corresponding gas source and the gas controller is installed between the gas supplying pipe and the gas source.

* * * * *